(12) United States Patent
Park et al.

(10) Patent No.: US 11,160,175 B2
(45) Date of Patent: Oct. 26, 2021

(54) DISPLAY APPARATUS

(71) Applicant: Samsung Display Co., Ltd., Yongin-si (KR)

(72) Inventors: Dongjin Park, Yongin-si (KR); Dongwoo Seo, Yongin-si (KR); Jaiku Shin, Yongin-si (KR); Sungchul Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/848,570

(22) Filed: Apr. 14, 2020

(65) Prior Publication Data

US 2021/0068274 A1 Mar. 4, 2021

(30) Foreign Application Priority Data

Sep. 2, 2019 (KR) .................. 10-2019-0108461

(51) Int. Cl.
| | | |
|---|---|---|
| *G09F 9/30* | (2006.01) | |
| *H05K 5/00* | (2006.01) | |
| *H05K 5/03* | (2006.01) | |
| *H01L 27/32* | (2006.01) | |
| *H01L 51/52* | (2006.01) | |

(52) U.S. Cl.
CPC ....... *H05K 5/0017* (2013.01); *H01L 27/3225* (2013.01); *H05K 5/03* (2013.01); *H01L 27/3244* (2013.01); *H01L 51/5253* (2013.01); *H01L 2251/5338* (2013.01)

(58) Field of Classification Search
CPC .................. H05K 5/0017; H05K 5/03; H01L 2251/5338; H04M 1/0268; G02F 1/1333; G09F 9/301
See application file for complete search history.

(56) References Cited

U.S. PATENT DOCUMENTS

| | | |
|---|---|---|
| 10,362,696 B2 | 7/2019 | Ahn |
| D862,407 S | 10/2019 | Lee et al. |
| 10,812,641 B2 | 10/2020 | Cheng |
| 2013/0258234 A1 | 10/2013 | Park et al. |

(Continued)

FOREIGN PATENT DOCUMENTS

| | | |
|---|---|---|
| CN | 107229148 A | 10/2017 |
| CN | 109120753 A | 1/2019 |

(Continued)

OTHER PUBLICATIONS

EPO Extended European Search Report dated Dec. 8, 2020, for corresponding European Patent Application No. 20193843.8 (7 pages).

*Primary Examiner* — Donald L Raleigh
(74) *Attorney, Agent, or Firm* — Lewis Roca Rothgerber Christie LLP

(57) ABSTRACT

A display apparatus includes: a display panel comprising a first opening portion and a display area at least partially surrounding the first opening portion; a cushion layer under the display panel and comprising a second opening portion, the second opening portion corresponding to the first opening portion and having a planar size smaller than a planar size of the first opening portion; a supporting member in the first opening portion above the cushion layer; and a cover window supported by the supporting member and arranged above the display panel.

20 Claims, 9 Drawing Sheets

(56) References Cited

U.S. PATENT DOCUMENTS

| | | | |
|---|---|---|---|
| 2016/0011633 A1 | 1/2016 | Watanabe et al. | |
| 2016/0176151 A1 | 6/2016 | Oh et al. | |
| 2017/0287992 A1 | 10/2017 | Kwak et al. | |
| 2018/0053451 A1* | 2/2018 | Han | G09F 9/301 |
| 2018/0337224 A1* | 11/2018 | Aoki | G09G 3/3233 |
| 2019/0157609 A1* | 5/2019 | Suzuki | H01L 51/5246 |
| 2019/0245958 A1 | 8/2019 | Cheng | |
| 2019/0246018 A1 | 8/2019 | Rho et al. | |

FOREIGN PATENT DOCUMENTS

| | | |
|---|---|---|
| CN | 208401902 U | 1/2019 |
| KR | 10-2017-0112790 A | 10/2013 |
| KR | 10-2017-0111827 A | 10/2017 |
| KR | 10-2017-0112790 A | 10/2017 |
| KR | 10-2018-0026288 A | 3/2018 |
| KR | 10-2018-0114565 A | 10/2018 |

\* cited by examiner 0.48μm 6.6μm

DISPLAY APPARATUS

CROSS-REFERENCE TO RELATED APPLICATION

The present application claims priority to and the benefit of Korean Patent Application No. 10-2019-0108461, filed on Sep. 2, 2019, in the Korean Intellectual Property Office, the disclosure of which is incorporated herein in its entirety by reference.

BACKGROUND

1. Field

Aspects of one or more embodiments relate to a display apparatus.

2. Description of Related Art

Recently, display apparatuses have been used for various purposes. In addition, due to relatively small thicknesses and light weight, the range of potential uses for display apparatuses has expanded.

As the potential uses for display apparatuses has expanded, various methods may be used for designing the form of display apparatuses, and functions that may be added or linked to the display apparatuses are increasing.

In addition, as display apparatuses are more widely used, foldable display apparatuses may be more commonly utilized.

The above information disclosed in this Background section is only for enhancement of understanding of the background and therefore the information discussed in this Background section does not necessarily constitute prior art.

SUMMARY

As a method increasing functions that may be added or linked to a display apparatus, one or more example embodiments include a display apparatus including areas, in which a camera, a sensor, and the like may be arranged in an inner side of a display area.

One or more example embodiments include a foldable display apparatus having relatively high reliability.

However, the above-described characteristics are merely examples of some characteristics of embodiments according to the present disclosure, and the scope of the embodiments according to the present disclosure is not limited thereto.

Additional aspects will be set forth in part in the description which follows and, in part, will be more apparent from the description, or may be learned by practice of the presented example embodiments of the disclosure.

According to some example embodiments, a display apparatus includes a display panel including a first opening portion and a display area at least partially surrounding the first opening portion, a cushion layer under the display panel and including a second opening portion, the second opening portion corresponding to the first opening portion and having a planar size smaller than a planar size of the first opening portion, a supporting member in the first opening portion above the cushion layer, and a cover window supported by the supporting member and arranged above the display panel.

According to some example embodiments, a planar size of the supporting member may be greater than the planar size of the second opening portion.

According to some example embodiments, the supporting member may be configured to shield the second opening portion.

According to some example embodiments, a planar size of the supporting member may be greater than the planar size of the second opening portion and smaller than the planar size of the first opening portion.

According to some example embodiments, the display apparatus may further include, under the cushion layer, a metal plate including a third opening corresponding to the second opening portion.

According to some example embodiments, a planar size of the third opening portion may be smaller than or equal to the planar size of the second opening portion.

According to some example embodiments, a planar size of the supporting member including a first point in the supporting member may be greater than a planar size of the supporting member including a second point, and the second point may be more closer to the cover window than the first point is.

According to some example embodiments, the supporting member may include glass or a polymer resin.

According to some example embodiments, the display apparatus may further include a component under the supporting member.

According to some example embodiments, the supporting member and the component may be spaced apart from each other.

According to some example embodiments, a planar size of the component may be smaller than the planar size of the second opening portion.

According to some example embodiments, a transmittance of the supporting member may be range from 70% to 100%.

According to some example embodiments, the display panel may include a flexible display panel.

According to some example embodiments, a display apparatus includes a display panel including a first opening portion and a display area at least partially surrounding the first opening portion, a cover window above the display panel, a cover glass connected to the cover window and arranged in the first opening portion, and a cushion layer under the cover glass, wherein the cushion layer may include a second opening portion corresponding to the first opening portion, and a planar size of the first opening portion is greater than a planar size of the second opening portion.

According to some example embodiments, the cover glass may be configured to shield the second opening portion.

According to some example embodiments, the display apparatus may further include, under the cushion layer, a metal plate including a third opening portion corresponding to the second opening portion.

According to some example embodiments, a size of the third opening portion may be smaller than or equal to a size of the second opening portion.

According to some example embodiments, the display apparatus may further include a component under the cover glass.

According to some example embodiments, a size of an upper surface of the cover glass may be smaller than a size of a lower surface of the cover glass.

According to some example embodiments, the display panel may include a flexible display panel.

Other aspects, features, and characteristics that are not described above will be more clearly understood from the accompanying drawings, claims, and detailed description.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1A:
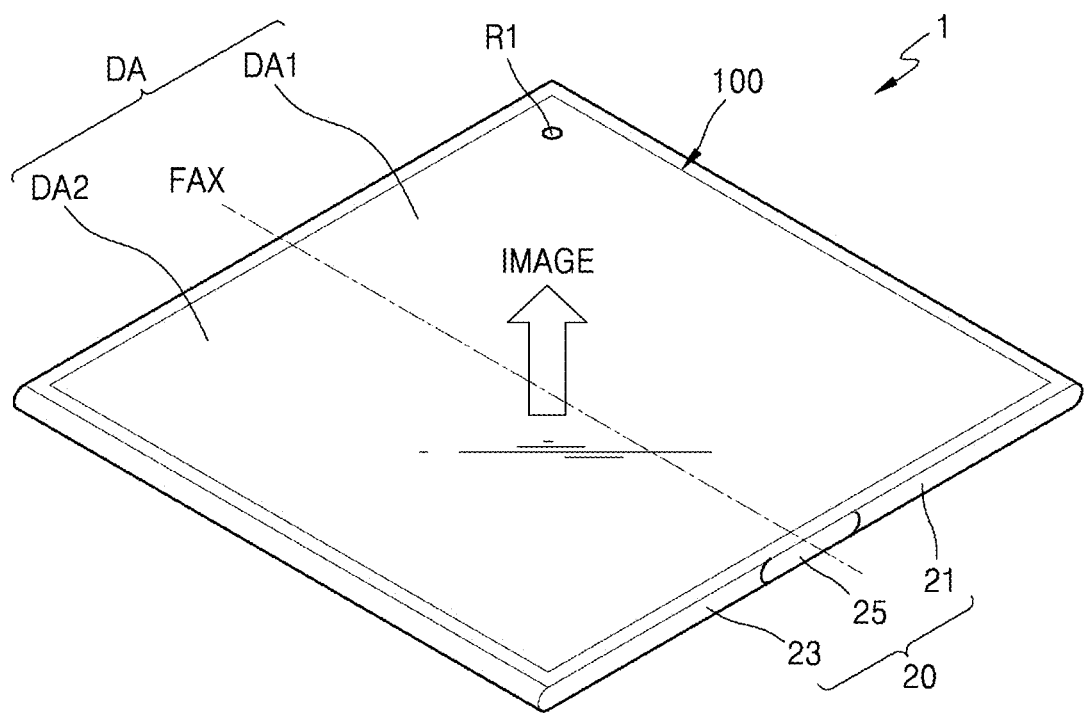
FIG. 1A is a schematic perspective view of a display apparatus according to some example embodiments.

Reference will now be made in detail to aspects of some embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, c, or variations thereof.

Reference will now be made in more detail to aspects of some embodiments, examples of which are illustrated in the accompanying drawings, wherein like reference numerals refer to like elements throughout, and some overlapping or repetitive description may be omitted.

It will be understood that although terms such as "first," "second" may be used to describe various components, these components are not limited by these terms, and the terms are only used to distinguish one component from one another.

As used herein, the singular forms "a," "an," and "the" are intended to include the plural forms as well, unless the context clearly indicates otherwise.

It will be further understood that the terms "comprise" and/or "comprising" used herein specify the presence of stated features or components, but do not preclude the presence or addition of one or more other features or components.

In the example embodiments, it will be understood that when a layer, an area, or a component is referred as being on another layer, area, or component, the layer, area, or component may be directly on the other layer, area, or component, or an intervening layer, area, or component may be present therebetween.

Sizes of components in the drawings may be exaggerated or reduced for convenience of explanation. In other words, since sizes and thicknesses of components in the drawings are arbitrarily illustrated for convenience of explanation, the present disclosure is not limited thereto.

When a certain embodiment may be differently implemented, a specific process order may be performed differently from the described order. For example, two consecutively described processes may be performed substantially at the same time or performed in an order opposite to the described order.

In following example embodiments, when a layer, area, or component is connected to another layer, area, or component, the layer, area, or component may be directly connected to the other layer, area, or component, and may be indirectly connected to the other layer, area, or component with another layer, area, or component therebetween. For example, in the present specification, when a layer, area, or component is electrically connected to another layer, area, or component, the layer, area, or component may be electrically connected in a direct manner to the other layer, area, or component, and electrically connected in an indirect manner to the other layer, area, or component with another layer, area, or component therebetween.

Figure 1B:
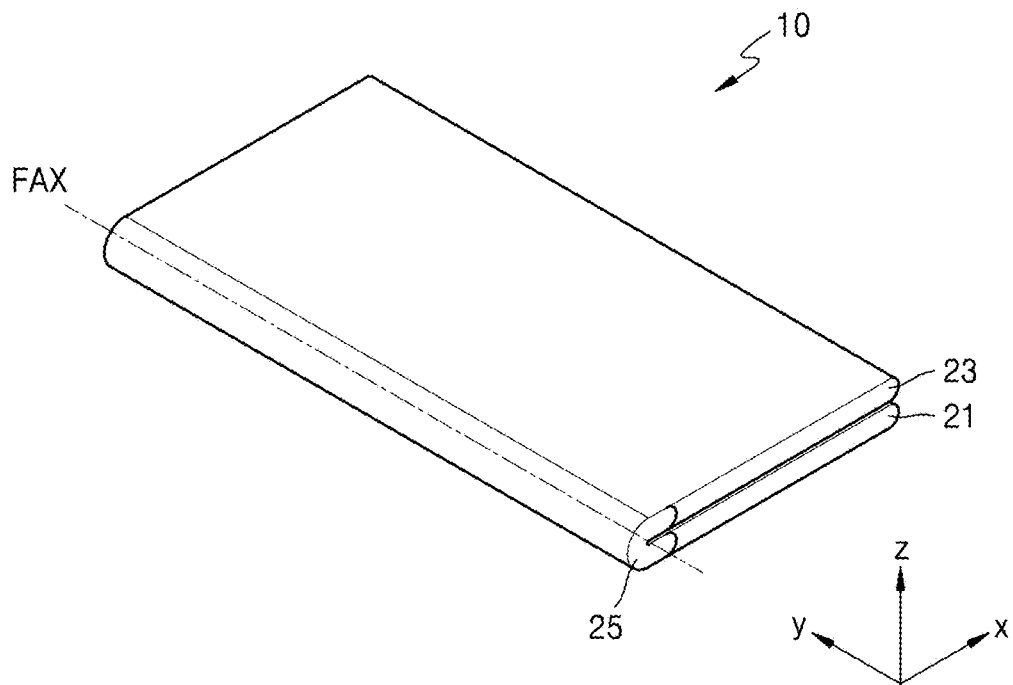
FIG. 1B is a perspective view illustrating a state in which a display apparatus according to some example embodiments is folded in one direction.
Figure 1C:
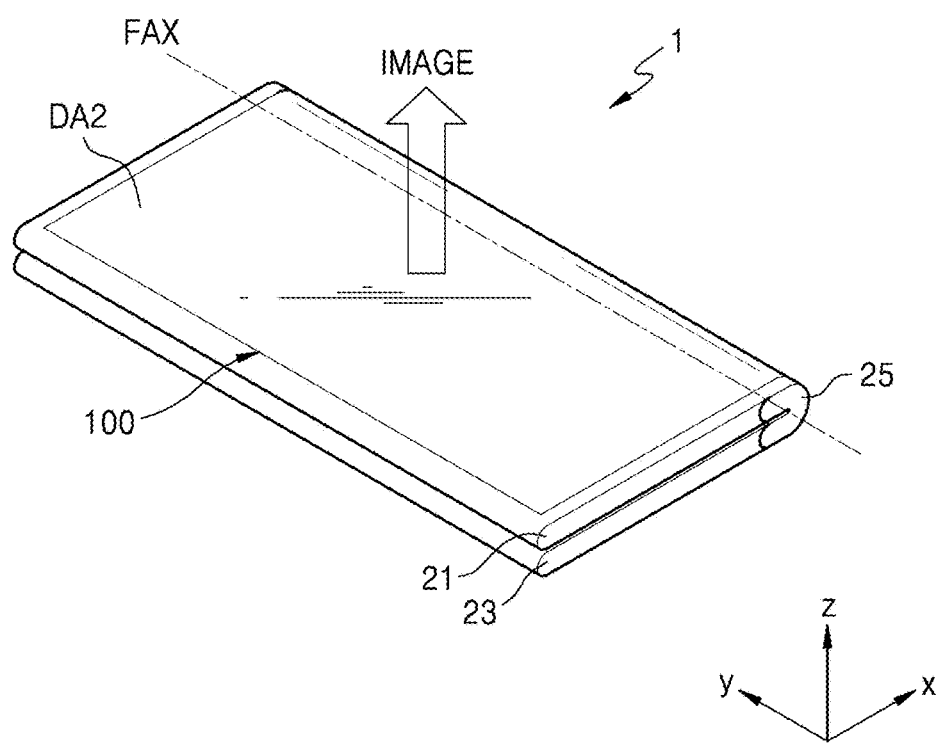
FIG. 1C is a perspective view illustrating a state in which a display apparatus according to some example embodiments is folded in an opposite direction to the direction of FIG. 1B

FIG. 1A schematically shows a display apparatus 1 according to some example embodiments; FIG. 1B illustrates a state in which the display apparatus 1 according to some example embodiments is folded in a direction; and FIG. 1C illustrates a state in which the display apparatus 1 according to some example embodiments is folded in an opposite direction (to the direction of FIG. 1B?).

Referring to FIG. 1A, the display apparatus 1 may include a display panel 100 and a housing or a case 20.

As an apparatus for displaying images, the display apparatus 1 may include a portable mobile apparatus such as a hand-held game console, a multimedia apparatus, and an ultramicro personal computer (PC). The display apparatus 1 to be described hereinafter may include a liquid crystal display, an electrophoretic display, an organic light-emitting display, an inorganic light-emitting display, a field emission display, a surface-conduction electron-emitter display, a quantum dot display, a plasma display, a cathode ray display, and the like. Hereinafter, the display apparatus 1 according to some example embodiments is described by taking an organic light-emitting display as an example, but the embodiments may be applied to various types of display apparatuses as described above.

The display panel 100 may include a display area DA that may provide images and a first region R1 that is at least partially surrounded by the display area DA. According to some example embodiments, the first region R1 may be completely surrounded by the display area DA. According to some example embodiments, however, the first region R1 may be only partially surrounded by the display area DA. In addition, the first region R1 may include a transmission area. Although FIG. 1A shows that the first region R1 is arranged as one region at an edge of the display panel 100, according to some example embodiments, the first region R1 may be arranged in plurality at various locations on the display panel 100.

The case 20 may include a first portion 21 and a second portion 23 respectively supporting portions of the display panel 100. The case 20 may be folded about a folding axis FAX between the first portion 21 and the second portion 23. According to some example embodiments, a third portion 25 between the first portion 21 and the second portion 23 may have a hinge structure.

Referring to FIGS. 1A and 1B, the display panel 100 may be folded together with the case 20, and portions of the display panel 100 folded about the folding axis FAX traversing the display area DA may face each other. Hereinafter, for convenience of explanation, of the display area DA that is a screen area, portions arranged at the two opposing sides about the folding axis FAX are respectively referred to as a first display area DA1 and a second display area DA2.

The display panel 100 and the case 20 may be folded with reference to the folding axis FAX such that the first portion 21 and the second portion 23 face each other. For example, referring to FIG. 1C, the first portion 21 and the second portion 23 may be arranged to face each other. In other words, two portions of a rear surface of the display apparatus 1 may be arranged to face each other. Accordingly, a certain image may be displayed on the first display area DA1 exposed in a direction and the second display area DA2 exposed toward another direction.

Although FIGS. 1A through 1C show only one folding axis FAX, according to some example embodiments, the display apparatus 1 may include a plurality of folding axes FAX. In addition, the folding axis FAX may also be arranged in a second direction that intersects with a first direction. For example, the folding axis FAX may be in parallel to the y direction. However, the folding axis FAX may also be in parallel to the x direction that intersects with the y direction.

Hereinafter, a state of the display apparatus 1 before being folded will be described in more detail below.

Figure 2A:
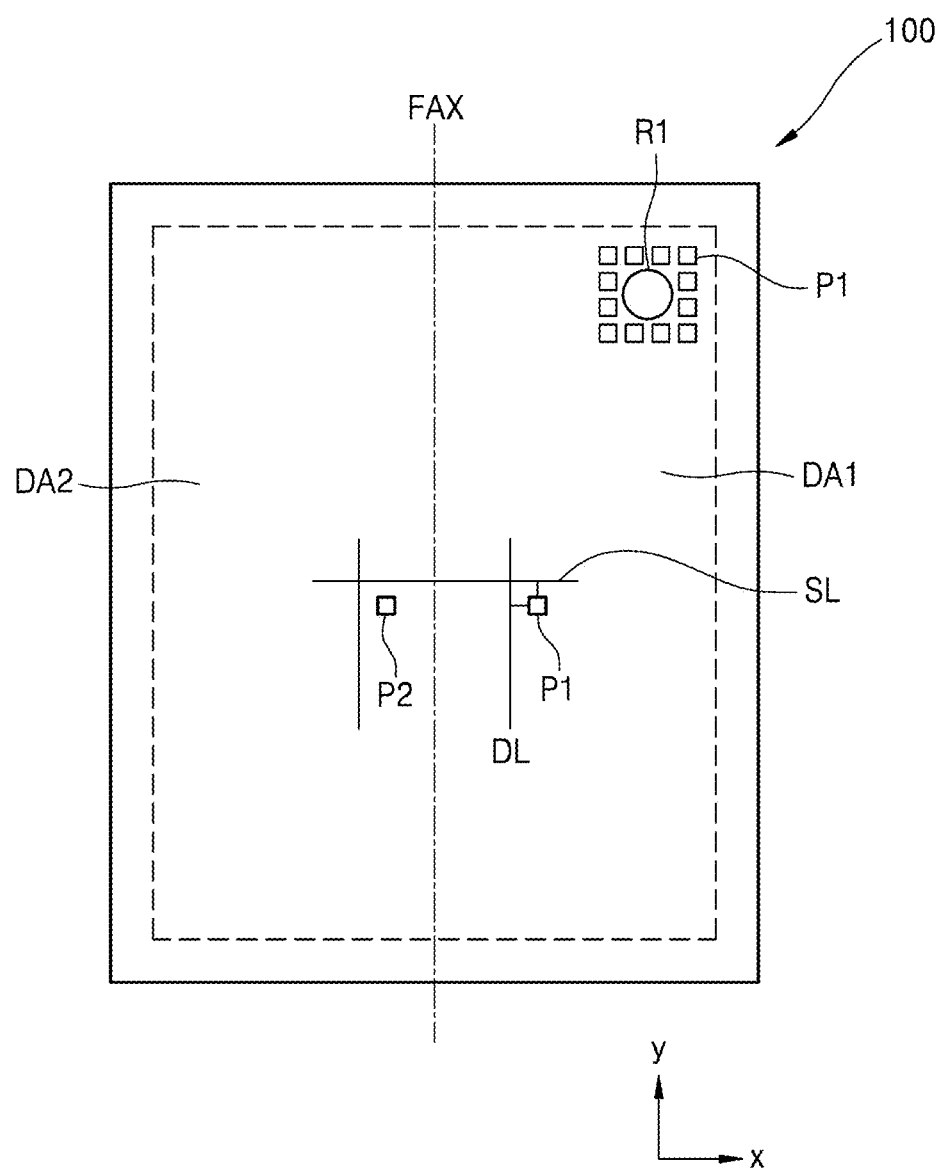
FIG. 2A is a top-plan view showing a layout of pixels in a display panel according to some example embodiments.
Figure 2B:
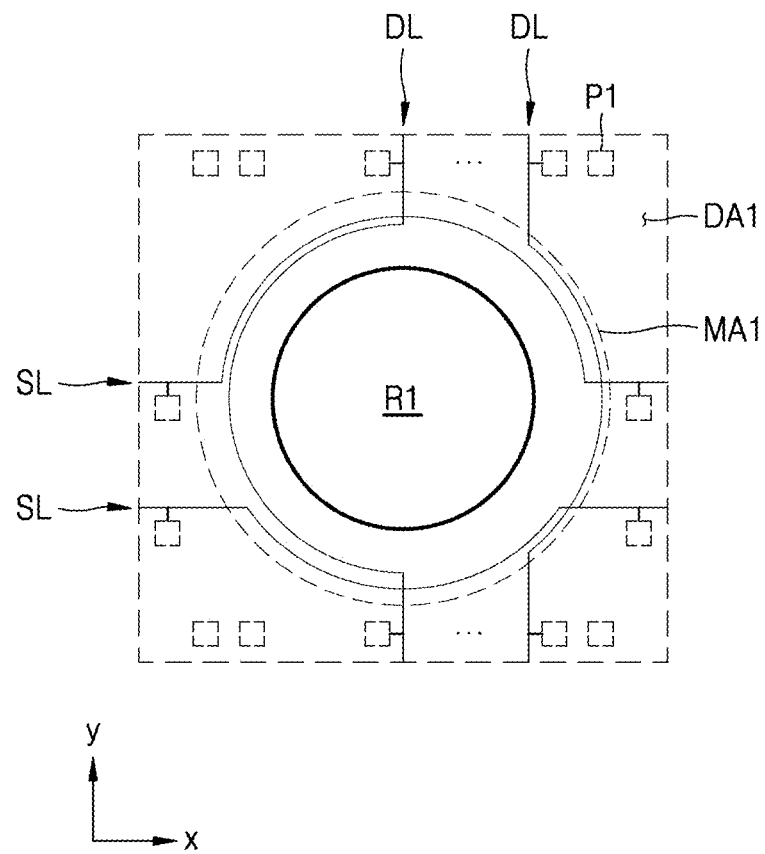
FIG. 2B is an excerpt of a top-plan view of a periphery of a first region of a display panel according to some example embodiments.

FIG. 2A is a top-plan view showing a layout of pixels of the display panel 100 according to some example embodiments, and FIG. 2B is an excerpt top-plan view of a periphery of the first region R1 of the display panel 100 according to some example embodiments.

Referring to FIG. 2A, a plurality of pixels may be arranged in display areas of the display panel 100, that is, the first display area DA1 and the second display area DA2. A plurality of first pixels P1 arranged in the first display area DA1 may each emit red, green, or blue light, and the first display area DA1 may provide or display a certain image by using the light emitted from the first pixels P1. Second pixels P2 arranged in the second display area DA2 may each emit red, green, or blue light, and the second display area DA2 may provide or display an image (e.g., a preset image) by using the light emitted from the second pixels P2.

Each of the first regions R1 is a region in which pixels are not arranged, and the first pixels P1 may be arranged around the first region R1. The first pixels P1 are arranged along an edge of the first region R1, and two adjacent first pixels P1 may be arranged along the edge of the first region R1. The two adjacent pixels P1 may be apart from each other with the first region R1 therebetween.

The first pixels P1 may each be electrically connected to a scanning line SL extending in the first direction (for example, the x direction) and a data line DL extending in the second direction (for example, the y direction). The scanning line SL and the data line DL respectively extending in the first direction and the second direction may detour around the first region R1. As shown in FIG. 2B, the scanning lines SL may each extend in the first direction and detour along or around the edge of the first region R1, and the data lines DL may each extend in the second direction and detour along or around the edge of the first region R1.

As described above, a first detour area MA1 along which the scanning lines SL and/or the data lines DL detour may be arranged between the first region R1 and the first display area DA1.

Figure 3:
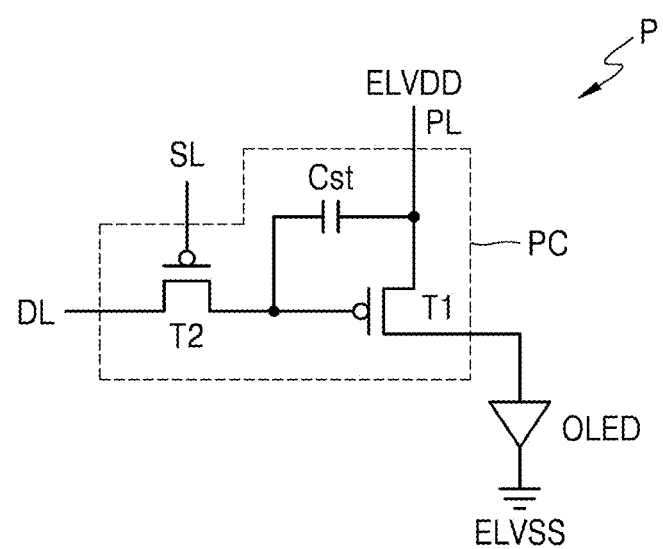
FIG. 3 is an equivalent circuit diagram of a pixel included in a display panel of a display apparatus according to some example embodiments.

FIG. 3 is an equivalent circuit diagram of a pixel P included in the display panel 100 of the display apparatus 1 according to some example embodiments.

Referring to FIG. 3, the pixel P may include a pixel circuit PC and an organic light-emitting diode OLED as a display element connected to the pixel circuit PC.

The pixel circuit PC may include a first thin-film transistor T1, a second thin-film transistor T2, and a storage capacitor Cst. Each pixel P may emit red, green, blue light or emit red, green, blue, or white light from the organic light-emitting diode OLED.

The second thin-film transistor T2, which is a switching thin-film transistor, may be connected to the scanning line SL and the data line DL and may be configured to deliver a data voltage input from the data line DL to the first thin-film transistor T1, based on a switching voltage input from the scanning line SL. The storage capacitor Cst may be connected to the second thin-film transistor T2 and a driving voltage line PL and store a voltage corresponding to a difference between a voltage received from the second thin-film transistor T2 and a first power voltage ELVDD supplied to the driving voltage line PL.

The first thin-film transistor T1, which is a driving thin-film transistor, may be connected to the driving voltage line PL and the storage capacitor Cst and control a driving current flowing from the driving voltage line PL to the organic light-emitting diode OLED to correspond to a value of the voltage stored in the storage capacitor Cst. The organic light-emitting diode OLED may emit light having a certain luminance according to the driving current. A common electrode (for example, a cathode) of the organic light-emitting diode OLED may receive a second power voltage ELVSS.

Although the pixel circuit PC including two thin-film transistors and one storage capacitor is described with reference to FIG. 3, according to some example embodiments, the number of thin-film transistors and the number of storage capacitors may be variously modified according to designs of the pixel circuit PC. For example, the pixel circuit PC may further include one or more thin-film transistors in addition to the two thin-film transistors stated above.

The pixel P described with reference to FIG. 3 may correspond to each of the first pixel P1 and the second pixel P2 described above with reference to FIGS. 2A and 2B. For example, the first pixel P1 may include a first pixel circuit and a first organic light-emitting diode OLED1 connected thereto and the second pixel P2 may include a second pixel circuit and a second organic light-emitting diode OLED2 connected thereto.

The first pixel circuit and the second pixel circuit may include a same number of thin-film transistors and storage capacitors. According to some example embodiments, the first pixel circuit and the second pixel circuit may include different numbers of thin-film transistors and storage capacitors. For example, the first pixel circuit may include two thin-film transistors and one storage capacitor and the second pixel circuit may further include one or more thin-film transistors in addition to two thin-film transistors.

Figure 4:
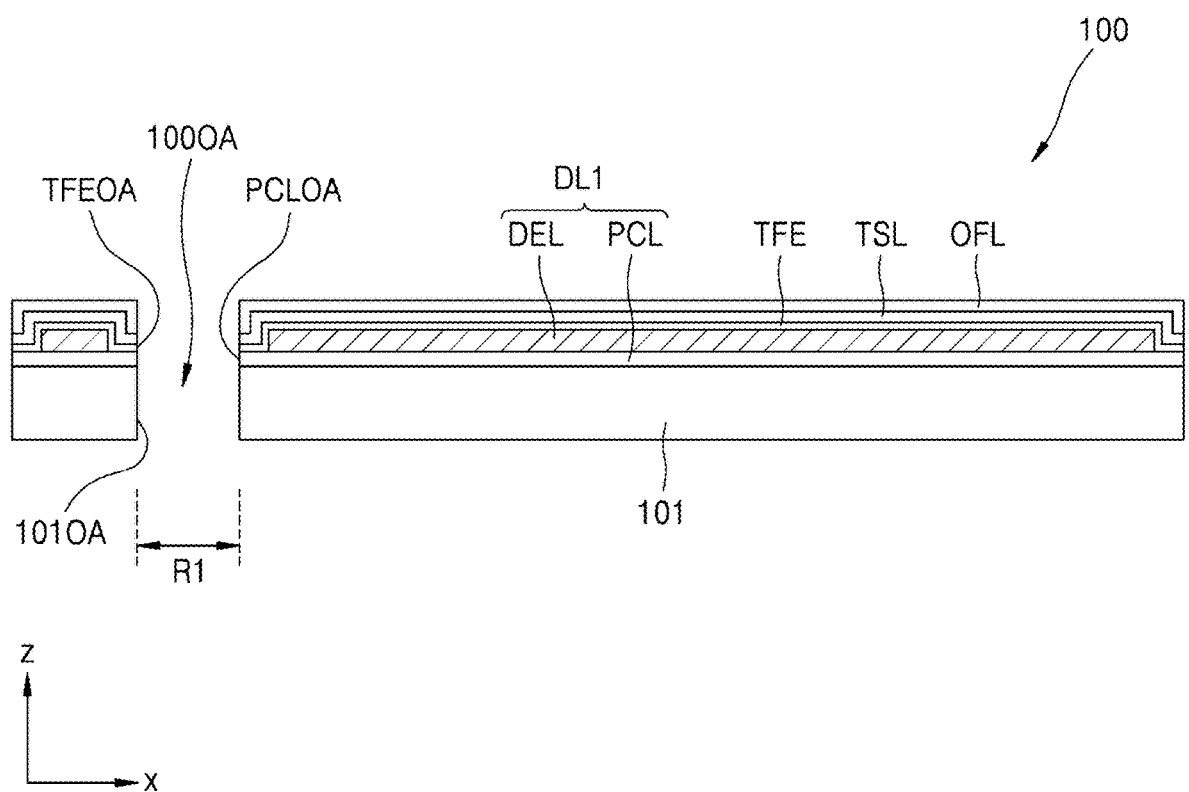
FIG. 4 is a schematic cross-sectional view of a display panel according to some example embodiments.

FIG. 4 is a schematic cross-sectional view of the display panel 100 according to some example embodiments.

Referring to FIG. 4, the display panel 100 includes a display layer DL1 arranged on a substrate 101. The substrate 101 may be flexible. The substrate 101 may include a polymer resin.

The substrate 101 may include a polymer resin such as polyethersulfone, polyarylate, polyetherimide, polyethylene naphthalate, polyethylene terephthalate, polyphenylene sulfide, polyimide, polycarbonate (PC), cellulose triacetate (TAC), cellulose acetate propionate, and the like.

A barrier layer may be further included between the display layer DL1 and the substrate 101. The barrier layer, which is a barrier layer for preventing or reducing permeation of external foreign materials or contaminants, may be a single layer or multi-layer including an inorganic material such as silicon nitride ($SiN_x$, x>0) or silicon oxide (SiOx, x>0).

The display layer DL1 may include a display element layer DEL, which includes a plurality of display elements, and a pixel circuit layer PCL including a pixel circuit and insulating layers. The display element layer DEL may include display elements, for example, first organic light-emitting diodes OLED1 and second organic light-emitting diodes OLED2 as described above. The pixel circuit layer PCL may include the pixel circuits and insulating layers respectively connected to the first organic light-emitting diodes OLED1 or the second organic light-emitting diodes OLED2. The pixel circuit layer PCL may include a plurality of transistors, storage capacitors, and insulating layers between the plurality of transistors and the storage capacitors.

Display elements may be covered by an encapsulation member such as a thin-film encapsulation layer TFE. The thin-film encapsulation layer TFE may include at least one inorganic encapsulation layer and at least one organic encapsulation layer covering the display element layer DEL. The display panel 100 includes the substrate 101, which includes the polymer resin, and the thin-film encapsulation layer TFE including the inorganic encapsulation layer and the organic encapsulation layer. Accordingly, the display panel 100 may be a flexible display panel having flexibility.

A touch electrode layer TSL including touch electrodes is arranged on the thin-film encapsulation layer TFE, and an optical functional layer OFL may be arranged on the touch electrode layer TSL. The touch electrode layer TSL may obtain coordinate information according to an external output, for example, a touch event. The optical functional layer OFL may reduce reflectivity of light (external light) incident from outside toward the display panel 100 and/or improve color purity of light emitted from the display panel 100. According to some example embodiments, the optical functional layer OFL may include a retarder and a polarizer. The retarder may include a film-type or liquid crystal coating-type retarder and include a $\lambda/2$ and/or a $\lambda/4$ retarder. The polarizer may also include a film-type polarizer or a liquid crystal coating-type polarizer. A film-type polarizer may include a stretched-type synthetic resin film, and a liquid crystal coating-type polarizer may include liquid crystals arranged into a certain arrangement. The retarder and the polarizer may further include a protection film.

As another example, the optical functional layer OFL may include a black matrix and color filters. The color filters may be arranged considering colors of light that is emitted from each pixel of the display panel 100. Each of the color filters may include a red, green, or blue pigment or dye. Alternatively, each of the color filters may further include quantum dots in addition to the pigment or dye stated above. Alternatively, some of the color filters may not include the pigment or dye stated above, and may include scattered particles such as titanium oxide.

As another example, the optical functional layer OFL may include a destructive interference structure. The destructive interference structure may include a first reflective layer and a second reflective layer respectively arranged on different layers. First reflected light and second reflected light respectively reflected from the first reflective layer and the second reflective layer may undergo destructive interference, and accordingly, a reflectance of external light may be reduced.

An adhesion member may be arranged between the touch electrode layer TSL and the optical functional layer OFL. General adhesion members known in the art may be non-limitedly adopted as the adhesion member. The adhesion member may be a pressure sensitive adhesive (PSA).

The display panel 100 may include a first opening portion 100OA corresponding to a first region R1. A plurality of layers constructing the display panel 100, for example, the substrate 101, the display layer DL1, and the thin-film encapsulation layer TFE, may respectively include opening portions 101OA, PCLOA, and TFEOA corresponding to the first opening portion 100OA.

Figure 5:
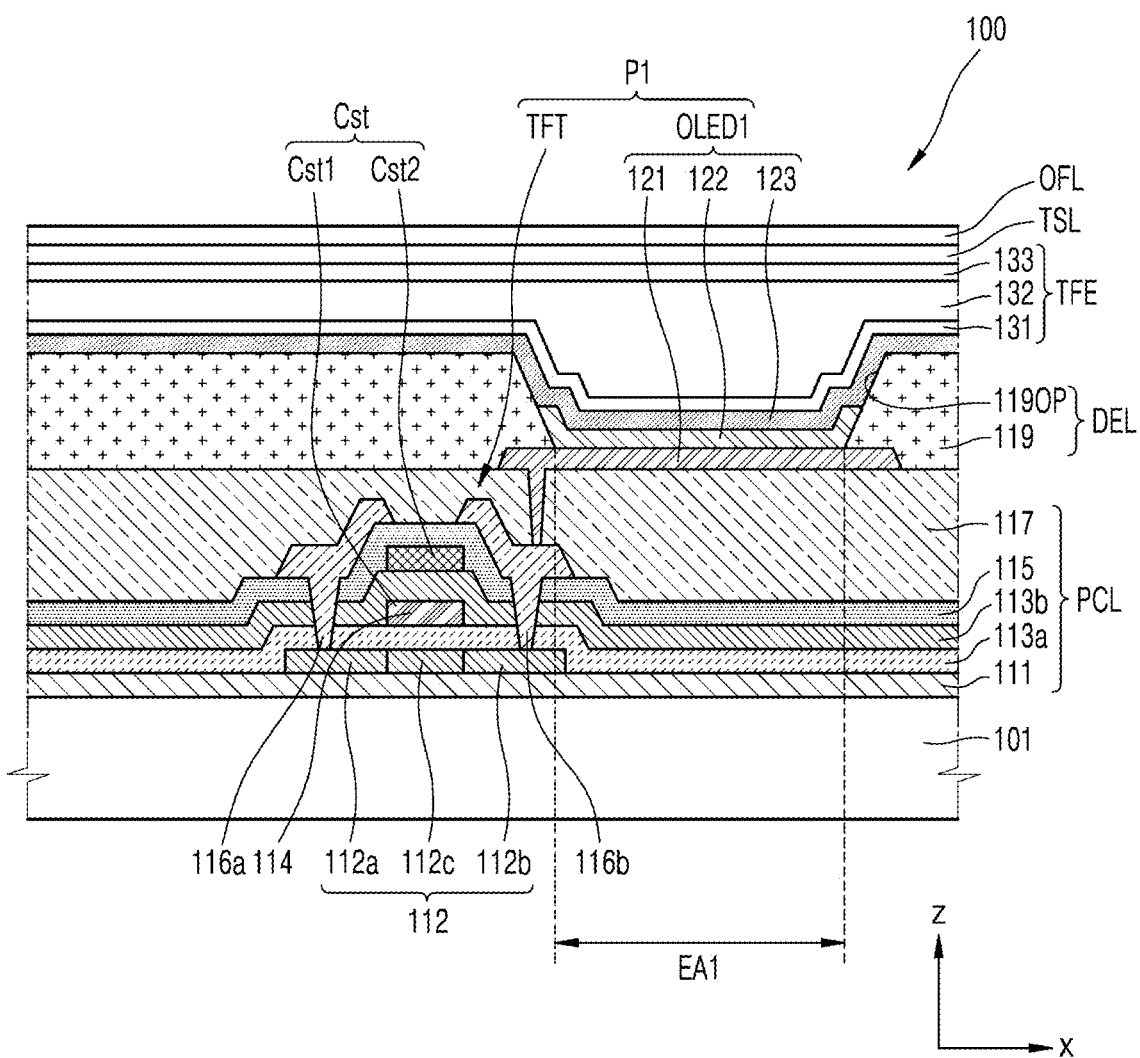
FIG. 5 shows a cross-section corresponding to a portion of a first pixel that is a portion of a display panel according to some example embodiments.

FIG. 5 shows a cross-section corresponding to a portion of the first pixel P1 that is a portion of the display apparatus 1 according to some example embodiments.

The pixel circuit layer PCL is arranged on the substrate 101. FIG. 5 shows that the pixel circuit layer PCL includes a thin-film transistor TFT and a buffer layer 111, a first gate insulating layer 113a, a second gate insulating layer 113b, an interlayer insulating layer 115, and a planarization insulating layer 117 arranged under and/or above components of the thin-film transistor TFT.

The buffer layer 111 may include an inorganic material, such as silicon nitride, silicon oxynitride, and silicon oxide, and may include a single layer or multi-layer including the above-stated inorganic material.

The thin-film transistor TFT may include a semiconductor layer 112, and the semiconductor layer 112 may include polysilicon. Alternatively, the semiconductor layer 112 may include amorphous silicon, an oxide semiconductor, an organic semiconductor, or the like. The semiconductor layer 112 may include a channel area 112c and a drain area 112a and a source area 112b respectively arranged at two sides of the channel area 112c. A gate electrode 114 may overlap the channel area 112c.

The gate electrode 114 may include a low-resistance metal material. The gate electrode 114 may include a conductive material including molybdenum (Mo), aluminum (Al), copper (Cu), titanium (Ti), and the like and include a multi-layer or single layer including the above-stated material.

The first gate insulating layer 113a between the semiconductor layer 112 and the gate electrode 114 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113b may be provided to cover the gate electrode 114. Similar to the first gate insulating layer 113a, the second gate insulating layer 113b may include an inorganic insulating material such as $SiO_2$, $SiN_x$, SiON, $Al_2O_3$, $TiO_2$, $Ta_2O_5$, $HfO_2$, or $ZnO_2$.

An upper electrode Cst2 of the storage capacitor Cst may be arranged on the second gate insulating layer 113b. The upper electrode Cst2 may overlap the gate electrode 114 under the upper electrode Cst2. In this case, the gate electrode 114 and the upper electrode Cst2 overlapping with the second gate insulating layer 113b therebetween may construct the storage capacitor Cst. That is, the gate electrode 114 may function as a lower electrode Cst1 of the storage capacitor Cst.

As described, the storage capacitor Cst and the thin-film transistor TFT may be formed to overlap each other. According to some example embodiments, the storage capacitor Cst may also be formed not to overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and include a single layer or multi-layer including the above-stated materials.

The interlayer insulating layer 115 may cover the upper electrode Cst2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The interlayer insulating layer 115 may include a single layer or multi-layer including the above-stated inorganic insulating materials.

A drain electrode 116a and a source electrode 116b may each be on the interlayer insulating layer 115. The drain electrode 116a and the source electrode 116b may include materials having excellent conductivity. The drain electrode 116a and the source electrode 116b may each include a conductive material including Mo, Al, Cu, Ti, and the like and include a multi-layer or single layer including the above-stated materials. According to some example embodiments, the drain electrode 116a and the source electrode 116b may each have a multi-layer structure of Ti/Al/Ti.

The planarization insulating layer 117 may include an organic insulating layer. The planarization insulating layer 117 may include an organic insulating material such as a general commercial polymer like polymethylmethacrylate (PMMA) or polystyrene (PS), a polymer derivative having a phenolic group, an acryl-based polymer, an imide-based polymer, an aryl ether-based polymer, an amide-based polymer, a fluoride-based polymer, a p-xylene based polymer, a vinyl alcohol-based polymer, and a blend thereof.

The display element layer DEL is arranged on the pixel circuit layer PCL of the above-described structure. The display element layer DEL may include the first organic light-emitting diode OLED1, and a pixel electrode 121 of the first organic light-emitting diode OLED1 may be electrically connected to the thin-film transistor TFT via a contact hole in the planarization insulating layer 117.

The pixel electrode 121 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 121 may include a reflective film including Ag, Mg, Al, Pt, Pd, Au, Ni, Nd, Ir, Cr, or a compound thereof. According to some example embodiments, the pixel electrode 121 may include a film including ITO, IZO, ZnO, or $In_2O_3$ above/under the above-stated reflective film.

A pixel defining layer 119 having an opening 119OP that exposes a center portion of the pixel electrode 121 is arranged on the pixel electrode 121. The pixel defining layer 119 may include an organic insulating material and/or an inorganic insulating material. The opening 119OP may define an emission area (hereinafter, referred to as a first emission area EA1) of light emitted from the first organic light-emitting diode OLED1. For example, a width of the opening 119OP may correspond to a width of the first emission area EA1.

An emission layer 122 may be arranged in the opening 119OP of the pixel defining layer 119. The emission layer 122 may include a high molecular weight organic material or a low molecular weight organic material emitting light of a certain color. According to some example embodiments, a first functional layer and a second functional layer may be arranged respectively under and above the emission layer 122. For example, the first functional layer may include a hole transport layer (HTL) or include an HTL and a hole injection layer (HIL). The second functional layer is a component arranged on the emission layer 122 and may be omitted. The second functional layer may include an electron transport layer (ETL) and/or an electron injection layer (EIL). The first functional layer and/or the second functional layer may be common layers formed to entirely cover the substrate 101, like a common electrode 123 to be described hereinafter.

The common electrode 123 may include a conductive material having a small work function. For example, the common electrode 123 may include a (semi)transparent layer including Ag, Mg, Al, Pt, Pd, Au, Ni, Nd, Ir, Cr, Li, Ca, an alloy thereof, and the like. Alternatively, the common electrode 123 may further include a layer such as ITO, IZO, ZnO, or $In_2O_3$ on the (semi)transparent layer including the above-stated materials.

The thin-film encapsulation layer TFE includes at least one inorganic encapsulation layer and at least one organic encapsulation layer. According to some example embodiments, FIG. 5 shows that the thin-film encapsulation layer TFE includes a first inorganic encapsulation layer 131, an organic encapsulation layer 132, and a second inorganic encapsulation layer 133 that are sequentially stacked.

The first inorganic encapsulation layer 131 and the second inorganic encapsulation layer 133 may include one or more inorganic materials from among aluminum oxide, titanium oxide, tantalum oxide, hafnium oxide, zinc oxide, silicon oxide, silicon nitride, and silicon oxynitride. The organic encapsulation layer 132 may include a polymer-based material. The polymer-based material may include an acryl-based resin, an epoxy-based resin, polyimide, polyethylene, and the like. According to some example embodiments, the organic encapsulation layer 132 may include acrylate.

A cross-sectional structure corresponding to the first pixel P1 as a portion of the display panel 100 has been described above with reference to FIG. 5. However, according to some example embodiments, the second pixel P2 as a portion of the display panel 100 may have a same structure as the first pixel P1 described above with reference to FIG. 5. For example, the second organic light-emitting diode OLED2 of the second pixel P2 may include a pixel electrode, an emission layer, and a common electrode. As described above with reference to FIG. 5, a second emission area of the second organic light-emitting diode OLED2 may be defined by an opening of a pixel defining layer that exposes the pixel electrode of the second organic light-emitting diode OLED2.

Figure 6:
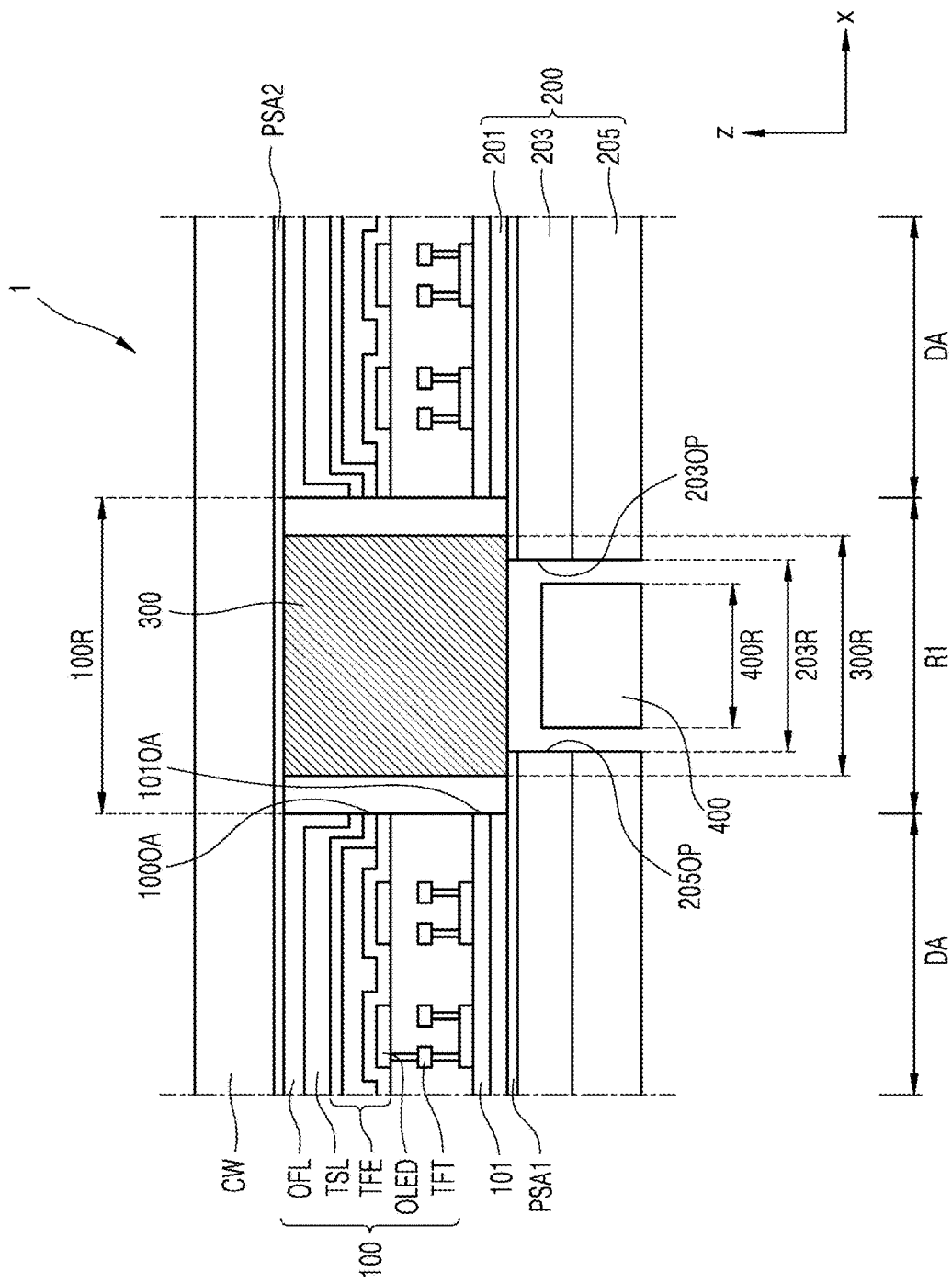
FIG. 6 is a cross-sectional view of a first region in a display apparatus according to some example embodiments.

FIG. 6 is a cross-sectional view of the first region R1 in the display apparatus 1 according to some example embodiments. In FIG. 6, as reference numerals that are the same as those in FIGS. 4 and 5 indicate same members, some repeated descriptions thereof will be omitted.

The display apparatus 1 may include the display panel 100, a cover window CW above the display panel 100, and a protective member 200 under the display panel 100. In addition, the display apparatus 1 may include a supporting member 300 to correspond to the first region R1. The display panel 100 may include the first opening portion 100OA as described above.

The cover window CW may be a flexible window member. The cover window CW may be flexibly bent by an external force without cracks occurring and the like and protect the display panel 100. The cover window CW may include glass, sapphire, or plastic. For example, the cover window CW may include ultra thin glass (UTG) or colorless polyimide (CPI). A general cover window known in the field may be non-limitedly used as the cover window CW. For example, the cover window CW may have a structure in which a flexible polymer layer is arranged on a surface of a glass substrate or only include a polymer layer. The display apparatus 1 may further include a protective film above the cover window CW.

The display apparatus 1 may include a protective member 200 under the display panel 100. The protective member 200 absorbs external impacts to prevent the organic light-emitting diode OLED and the like arranged on the display panel 100 from being damaged due to the external impacts. In addition, the protective member 200 attaches the display panel 100 without damaging other components such as a case 20.

The protective member 200 may include a film layer 201, a cushion layer 203, and a metal plate 205.

The film layer 201 may be arranged under the display panel 100. The film layer 201 may shield a region of the display panel except another region from which an image is output, such that the region is not seen by the user. In addition, the film layer 201 may block static electricity.

The film layer 201 may include a film layer opening portion to correspond to the first opening portion 100OA. In other words, the film layer 201 may include the film layer opening portion to correspond to the first region R1. A planar size (e.g., a footprint when viewed from a plan view) of the film layer opening portion may be identical to a planar size (e.g., a footprint when viewed from a plan view) of the first opening portion 100OA. In addition, the film layer opening portion may be connected to the first opening portion 100OA.

The film layer 201 may include at least one of carbon black, carbon nanotube, and $CrO_2$. The film layer 201 may also include a material mixed with resin and the like, in addition to the above-stated materials. Alternatively, the film layer 201 may include a black tape. The film layer 201 may include a publicly known material that is capable of blocking light.

The cushion layer 203 may be arranged under the film layer 201. The cushion layer 203 may protect the display panel 100 from external impacts.

The cushion layer 203 may include a second opening portion 203OP. The second opening portion 203OP may be arranged to correspond to the first opening portion 100OA. In other words, the second opening portion 203OP may be arranged to correspond to the first region R1.

A planar size of the second opening portion 203OP may be smaller than the planar size of the first opening portion 100OA. Regarding this, FIG. 6 shows that a width 203R of the second opening portion 203OP in a direction is less than a width 100R of the first opening portion 100OA in a direction.

Of the cushion layer 203, a portion adjacent to the second opening portion 203OP may be arranged in the first opening portion 100OA. That is, at least a portion of an upper surface of the cushion layer 203 may be arranged in the first opening portion 100OA. Accordingly, the supporting member 300 to be described in more detail later may be supported by the cushion layer 203.

The cushion layer 203 may include polymer resin foam. For example, the cushion layer 203 may include foam including polyurethane, polyethylene, polycarbonate, polypropylene, or polyolefin. However, the above-stated materials are only examples, and the cushion layer 203 may include a material that has excellent compressive stress and excellent absorption property for impact and vibration.

The cushion layer 203 and the film layer 201 may be connected to each other by using a first adhesive member PSA1. When the cushion layer 203 includes an adhesive material, the first adhesive member PSA1 may be omitted. The first adhesive member PSA1 may include an adhesive material such as a polyurethane-based material, a polyacryl-based material, a polyester-based material, a polyepoxy-based material, or a polyvinyl acetate-based material. However, the first adhesive member PSA1 is not limited thereto, and the first adhesive member PSA1 may include any suitable adhesive material for connecting the cushion layer 203 and the film layer 201.

The metal plate 205 may be arranged under the cushion layer 203. The metal plate 205 may protect the display panel 100 from external heat, electromagnetic waves, and the like.

The metal plate 205 may include a third opening portion 205OP. The third opening portion 205OP may be arranged to correspond to the second opening portion 203OP. In addition, the third opening portion 205OP and the second opening portion 203OP may be connected to each other.

A planar size of the third opening portion 205OP may be smaller than or identical to the planar size of the second opening portion 203OP. For example, a width of the third opening portion 205OP in a direction may be smaller than or identical to a width of the second opening portion 203OP in a direction. Accordingly, the metal plate 205 may stably support the cushion layer 203 that supports the supporting member 300.

The metal plate 205 may include a high modulus material. For example, the metal plate 205 may include at least one of invar, nobinite, stainless, and an alloy thereof. As the metal plate 205 may include a highly modulus material, even when the display panel 100 is repeatedly bent, the metal plate 205 may not be deformed.

The supporting member 300 may be arranged over the cushion layer 203. For example, the supporting member 300 may be supported by the cushion layer 203.

The supporting member 300 may be arranged to correspond to the first opening portion 100OA. Accordingly, the supporting member 300 may be arranged on the second opening portion 203OP and shield the second opening portion 203OP. In other words, the supporting member 300 may be arranged in an area of the cushion layer 203 that is adjacent to the second opening portion 203OP.

The supporting member 300 may support the cover window CW. For example, a lower portion of the supporting member 300 may be connected to the cushion layer 203 and an upper portion of the supporting member 300 may be connected to the cover window CW. The supporting member 300 may be connected to the cushion layer 203 through the first adhesive member PSA1. In addition, the supporting member 300 may also be connected to the cover window CW through a second adhesive member PSA2. Referring to FIG. 6, the second adhesive member PSA2 is arranged on a whole lower surface of the cover window CW. However, according to some example embodiments, the second adhesive member PSA2 may be separately arranged in a portion being attached to the display panel 100 and a portion being attached to the supporting member 300.

A planar size of the supporting member 300 may be greater than the planar size of the second opening portion 203OP. For example, a width 300R of the supporting member 300 in a direction may be greater than a width 203R of the second opening portion 203OP in a direction. Accordingly, the supporting member 300 may shield the second opening portion 203OP and be connected to the cushion layer 203. The width 300R of the supporting member 300 in the direction may be smaller than the width 100R of the first opening portion 100OA in a direction. Accordingly, the supporting member 300 may be arranged in the first opening portion 100OA of the display panel 100.

The planar size of the supporting member 300 may be greater than a planar size of the third opening portion 205OP. For example, the width 300R of the supporting member 300 in the direction may be greater than a width of the third opening portion 205OP in a direction. Accordingly, the supporting member 300 may be supported by the cushion layer 203 and the cushion layer 203 may be stably supported by the metal plate 205.

According to some example embodiments, a thickness of the supporting member 300 (for example, a length in the z direction) may be identical to a thickness of the display panel 100. According to some example embodiments, a thickness of the supporting member 300 may be greater than a thickness of the display panel 100. Accordingly, the supporting member 300 may stably support the cover window CW.

The supporting member 300 may include glass, sapphire, or a polymer resin. Alternatively, the supporting member 300 may include a high modulus material. In addition, the supporting member 300 may include a transparent material that may transmit sound or light from a component 400 to be described later. For example, the supporting member 300 may include a material having a transmittance from about 70% to about 100%. Accordingly, the supporting member 300 may stably support the cover window CW and prevent or reduce deformation of the cover window CW. In addition, the supporting member 300 may transmit light or sound from the component 400.

The component 400 may be arranged to overlap the first region R1. The component 400 may be arranged under the display panel 100. For example, the component 400 may be arranged in the second opening portion 203OP or the third opening portion 205OP. Accordingly, the component 400 may be arranged under the supporting member 300. However, according to some example embodiments, the component 400 may be arranged under the third opening portion 205OP. The first region R1 may be understood as a location at which the component 400 is arranged, that is, a kind of component area (for example, a camera area, a sensor area, and the like).

The component 400 may be arranged or spaced apart from the supporting member 300, such that there is a separation between the component 400 and the supporting member 300. For example, the component 400 may be arranged or spaced apart from the supporting member 300 under the supporting member 300. When the display apparatus 1 is folded, the cushion layer 203 may shrink or compress. In this case, the component 400 may remain sufficiently separated from the supporting member 300 and may not undergo interference or come into contact with with the supporting member 300.

A planar size of the component 400 may be smaller than the planar size of the second opening portion 203OP. In addition, the planar size of the component 400 may be smaller than the planar size of the third opening portion 205OP. For example, a width 400R of the component 400 in a direction may be smaller than the width 203R of the second opening portion 203OP in the direction. In addition, the width 400R of the component 400 in the direction may be smaller than a width of the third opening portion 205OP in a direction. Accordingly, the component 400 may be arranged in the second opening portion 203OP or the third opening portion 205OP.

The component 400 may be an electronic element that may output and/or receive sound or light. For example, the electronic element may include a sensor for outputting and/or receiving light, such as an infrared ray sensor, a camera for receiving light and capturing an image, a small-sized lamp for outputting light, a speaker for outputting sound, a microphone for receiving sound, and the like. The sensor may include a proximity sensor, a luminance sensor, a sensor for recognizing an iris, a sensor for recognizing a fingerprint, and the like. An electronic element using light may use light of various wavelength bands such as visible light, infrared light, ultraviolet light, and the like.

The first region R1 may be a region through which sound or/and light proceeding to the outside from the component 400 or proceeding toward the component 400 may be transmitted. The sound or/and light emitted from the component 400 may proceed to the outside via the first region R1, and external light or/and sound may proceed toward the component 400 via the first region R1.

The supporting member 300 may be arranged to prevent or reduce deformation of the cover window CW when the display apparatus 1 is folded. When the display apparatus 1 is a foldable display apparatus 1 and is repeatedly folded, the cover window CW may be deformed. For example, when the cover window CW is not supported by the supporting member 300 in the first region R1, the cover window CW may be deformed in the first region R1. When the cover window CW in the first region R1 is deformed, light or sound proceeding toward (i.e., received by) the component 400 may be distorted.

To minimize or reduce the above-stated phenomenon, according to some example embodiments, the supporting member 300 may be arranged on the cushion layer 203. That is, even when the display apparatus 1 is repeatedly folded, the supporting member 300 that has a relatively high modulus may be arranged under the cover window CW and prevent or reduce deformation of the cover window CW. Accordingly, distortion of light or sound proceeding toward the component 400 arranged in the first region R1 may be prevented or reduced. In addition, according to some example embodiments, even when the cover window CW is repeatedly folded, crack of the cover window CW in the first region R1 may be prevented or reduced.

External impacts may be delivered from the cover window CW to the supporting member 300. However, according to some example embodiments, as the supporting member 300 is arranged over the cushion layer 203, the cushion layer 203 may absorb the impacts.

Figure 7:
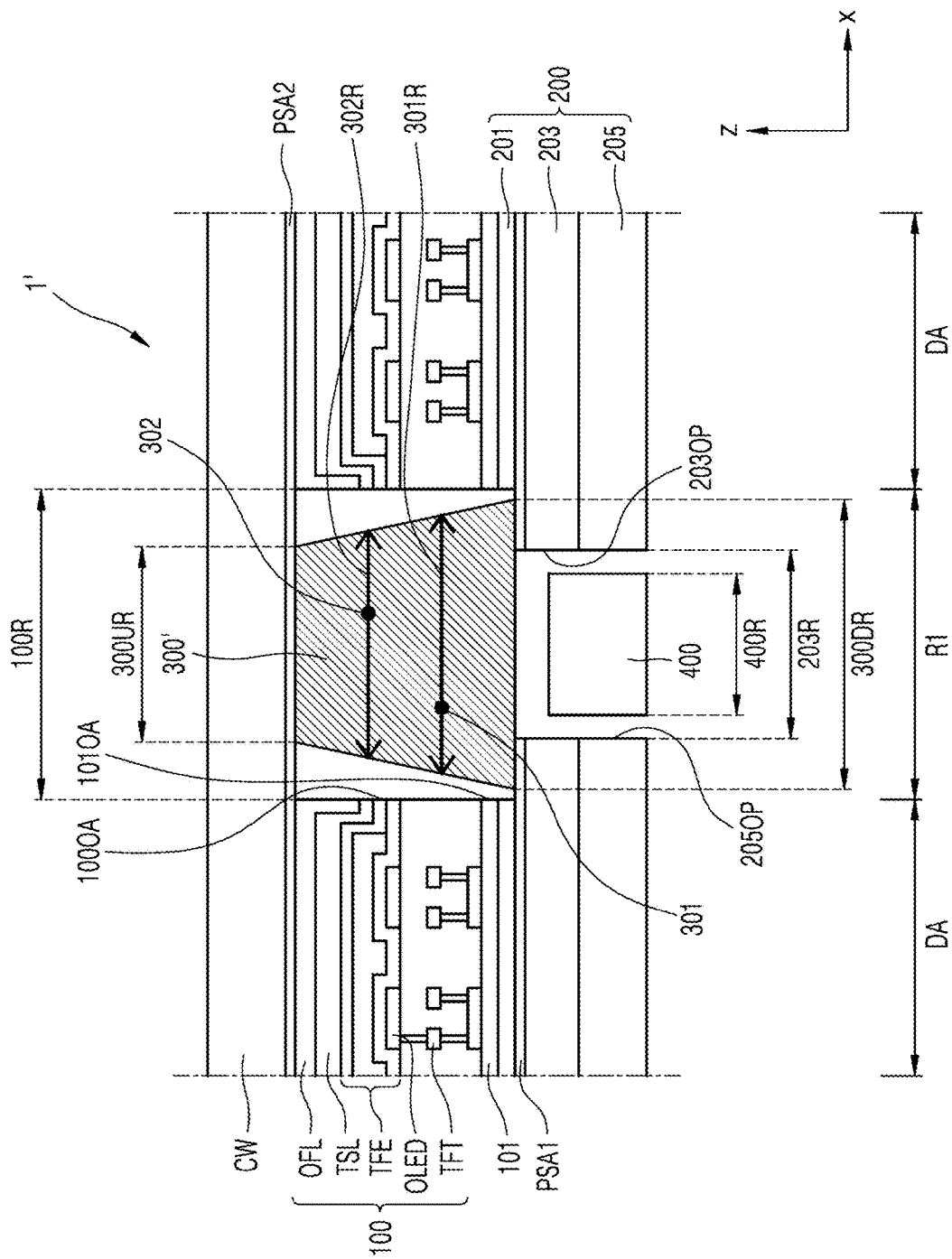
FIG. 7 is a cross-sectional view of a first region in a display apparatus according to some example embodiments.

FIG. 7 is a cross-sectional view of the first region R1 in a display apparatus 1' according to some example embodiments. In FIG. 7, as reference numerals that are the same as those in FIG. 6 indicate same members, repeated descriptions thereof may be omitted.

The display apparatus 1' may include the display panel 100, the cover window CW above the display panel 100, and the protective member 200 under the display panel 100. In addition, the display apparatus 1' may include a supporting member 300' to correspond to the first region R1.

A size of an upper surface of the supporting member 300' may be smaller than a size of a lower surface of the supporting member 300'. For example, a width 300UR of the upper surface of the supporting member 300' in a direction may be smaller than a width 300DR of the lower surface of the supporting member 300' in a direction. For example, a width 301R in a direction of a plane including a first point 301 in the supporting member 300' may be greater than a width 302R in a direction of a plane a second point 302 in the supporting member 300'. In this case, the second point 302 may be more adjacent to the cover window CW than the first point 301.

According to some example embodiments, in a planar view, the supporting member 300' may have a trapezoid shape. According to some example embodiments, it may be sufficient when the supporting member 300' has an upper surface having a smaller size than a lower surface thereof.

When the display apparatus 1' is folded, a degree of deformation of an upper portion of the display panel 100 may be greater than a degree of deformation of a lower portion of the display panel 100. That is, the degree of deformation of the display panel 100 may increase from the substrate 101 of the display panel 100 toward the cover window CW.

Accordingly, the supporting member 300 may be designed in consideration of the degree of deformation of the display panel 100 based on a thickness direction of the display panel 100. In other words, interference between the supporting member 300' and the display panel 100 may be prevented or reduced by having the width 300UR of the upper surface of the supporting member 300' in the direction smaller than the width 300DR of the lower surface of the supporting member 300' in the direction.

Figure 8A:
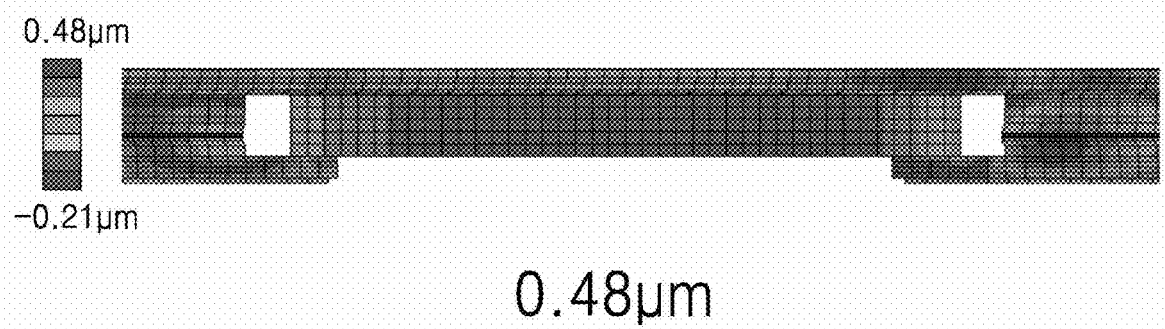
FIG. 8A shows a simulation result according to some example embodiments.
Figure 8B:
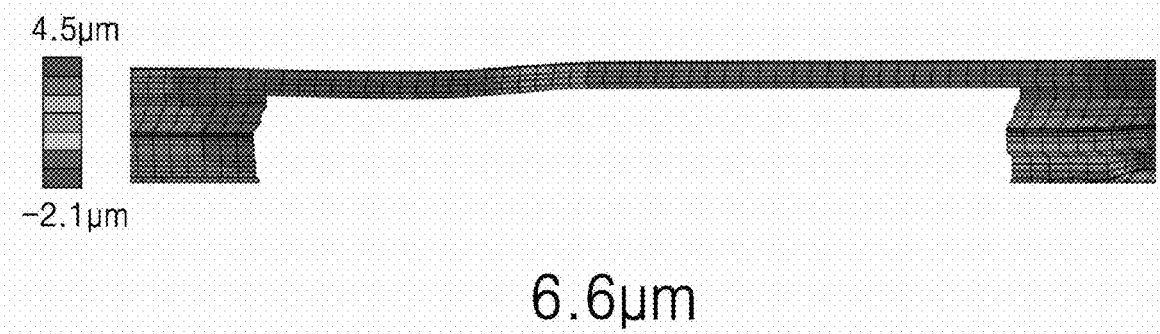
FIG. 8B shows a simulation result of a comparative example for comparison with an embodiment.

FIG. 8A shows a simulation result of an embodiment. FIG. 8B shows a simulation result of a comparative example for comparison with the embodiment.

Referring to FIG. 8A, the cover window may be deformed when a supporting member is arranged on a cushion layer, the supporting member is arranged so as to be connected to the cover window, and the display apparatus is repeatedly folded and unfolded. As a simulation result according to some example embodiments, a maximum deformation value of the cover window was 0.48 um. The deformation is deformation of the cover window in a thickness direction.

FIG. 8B shows a simulation result of deformation of the cover window when the display apparatus of the comparative example, in which the supporting member is not arranged, is repeatedly folded and unfolded. In the comparative example, a maximum deformation value of the cover window is 6.6 um. The deformation is deformation of the cover window in a thickness direction.

Accordingly, when the supporting member is arranged on the cushion layer and the supporting member is arranged so as to be connected to the cover window, the deformation of the cover window may be prevented or reduced.

The display apparatus according to some example embodiments have been described by using the term supporting member 300, but the embodiments are not limited thereto. For example, the supporting member 300 may also be understood as the cover glass.

As described above, according to some example embodiments, a display apparatus having high reliability by preventing deformation of the cover window by arranging a supporting member in a transmission area in which a camera or the like is arranged, may be provided.

It should be understood that embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
a display panel comprising a first opening portion and a display area at least partially surrounding the first opening portion;
a cushion layer under the display panel and comprising a second opening portion, the second opening portion corresponding to the first opening portion and having a planar size smaller than a planar size of the first opening portion;
a supporting member in the first opening portion above the cushion layer; and
a cover window supported by the supporting member and arranged above the display panel.

2. The display apparatus of claim 1, wherein a planar size of the supporting member is greater than the planar size of the second opening portion.

3. The display apparatus of claim 2, wherein the supporting member is configured to shield the second opening portion.

4. The display apparatus of claim 1, wherein a planar size of the supporting member is greater than the planar size of the second opening portion and smaller than the planar size of the first opening portion.

5. The display apparatus of claim 1, further comprising, under the cushion layer, a metal plate comprising a third opening portion corresponding to the second opening portion.

6. The display apparatus of claim 5, wherein a planar size of the third opening portion is smaller than or equal to a planar size of the second opening portion.

7. The display apparatus of claim 1, wherein a planar size of the supporting member comprising a first point in the supporting member is greater than a planar size of the supporting member comprising a second point, and the second point is closer to the cover window than the first point.

8. The display apparatus of claim 1, wherein the supporting member comprises glass or a polymer resin.

9. The display apparatus of claim 1, further comprising a component under the supporting member.

10. The display apparatus of claim 9, wherein the supporting member and the component are spaced apart from each other.

11. The display apparatus of claim 9, wherein a planar size of the component is smaller than a planar size of the second opening portion.

12. The display apparatus of claim 1, wherein a transmittance of the supporting member ranges from 70% to 100%.

13. The display apparatus of claim 1, wherein the display panel includes a flexible display panel.

14. A display apparatus comprising:
a display panel comprising a first opening portion and a display area at least partially surrounding the first opening portion;
a cover window above the display panel;
a cover glass connected to the cover window and arranged in the first opening portion; and
a cushion layer under the cover glass, wherein
the cushion layer comprises a second opening portion corresponding to the first opening portion, and
a planar size of the first opening portion is greater than a planar size of the second opening portion.

15. The display apparatus of claim 14, wherein the cover glass is configured to shield the second opening portion.

16. The display apparatus of claim 14, further comprising, under the cushion layer, a metal plate comprising a third opening portion corresponding to the second opening portion.

17. The display apparatus of claim 16, wherein a size of the third opening portion is smaller than or equal to a size of the second opening portion.

18. The display apparatus of claim 14, further comprising a component under the cover glass.

19. The display apparatus of claim 14, wherein a size of an upper surface of the cover glass is smaller than a size of a lower surface of the cover glass.

20. The display apparatus of claim 14, wherein the display panel includes a flexible display panel.

\* \* \* \* \*